United States Patent [19]
Yoshimura

[11] Patent Number: 6,037,605
[45] Date of Patent: Mar. 14, 2000

[54] SEMICONDUCTOR DEVICE AND METHOD OF MANUFACTURING THE SAME

[75] Inventor: Hisao Yoshimura, Kanagawa-ken, Japan

[73] Assignee: Kabushiki Kaisha Toshiba, Kawasaki, Japan

[21] Appl. No.: 08/914,123

[22] Filed: Aug. 19, 1997

[30]    Foreign Application Priority Data

Aug. 20, 1996  [JP]  Japan .................................. 8-218690

[51] Int. Cl.[7] .......................... H01L 29/06; H01L 29/788
[52] U.S. Cl. .............................. 257/25; 257/30; 257/321; 327/420
[58] Field of Search ................................. 257/25, 30, 27, 257/104, 321, 327; 327/420; 438/264

[56]    References Cited

U.S. PATENT DOCUMENTS 5,736,765  4/1998  Oh et al. .................................. 257/321
5,834,793  11/1998  Shibata ..................................... 257/25

FOREIGN PATENT DOCUMENTS

57-13765  1/1982  Japan ..................................... 257/327

*Primary Examiner*—Mahshid Saadat
*Assistant Examiner*—George C. Eckert, II
*Attorney, Agent, or Firm*—Banner & Witcoff, Ltd.

[57]    ABSTRACT

A semiconductor device includes spaced apart source and drain regions formed in a semiconductor substrate and a gate electrode insulatively spaced from a channel region between the source region and the drain region by a gate insulating film. Insulating layers are respectively formed between the source region and the channel region and between the drain region and the channel region.

27 Claims, 8 Drawing Sheets

SEMICONDUCTOR DEVICE AND METHOD OF MANUFACTURING THE SAME

BACKGROUND OF THE INVENTION

1. Technical Field

The present invention generally relates to a semiconductor device and a method of manufacturing the same, and, more particularly, to a semiconductor device structure adapted for high integration and a manufacturing method thereof.

2. Description of the Related Art

Figure 1:
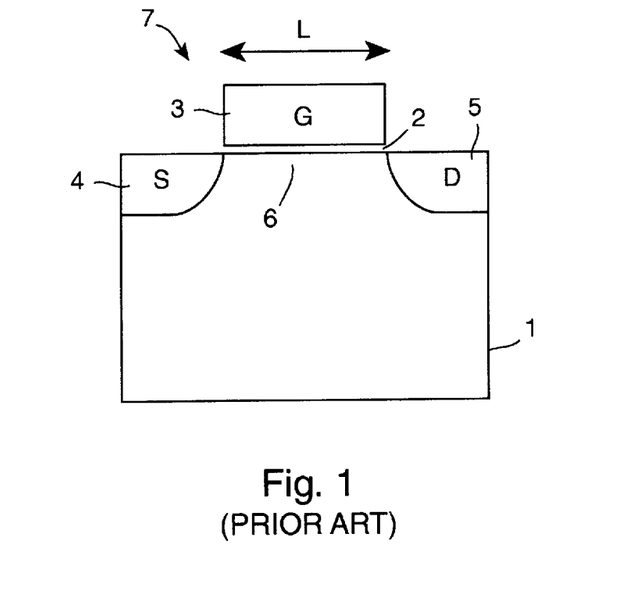
FIG. 1 is a schematic cross-sectional view of a conventional MOSFET.
Figure 2:
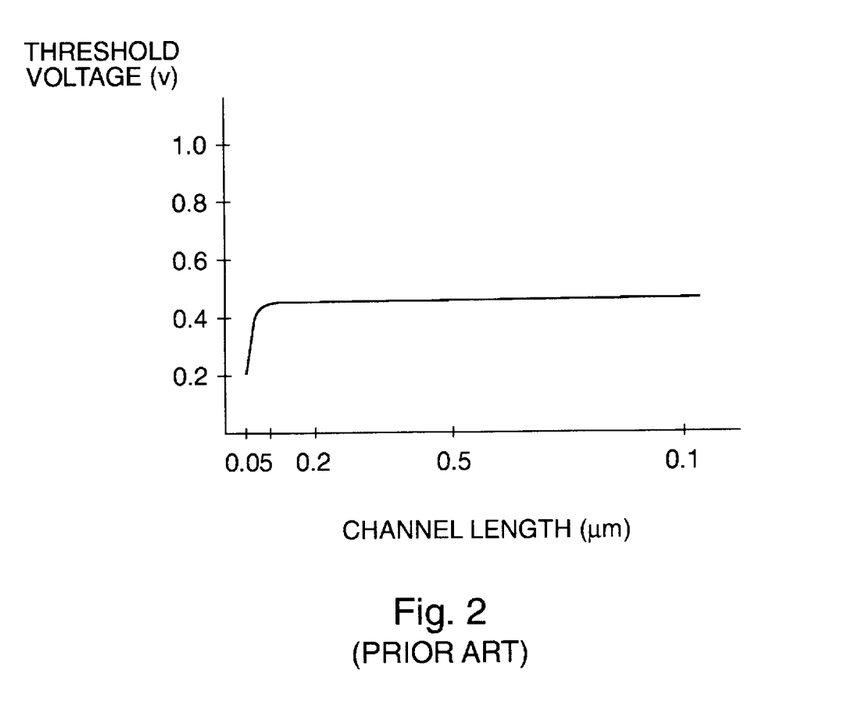
FIG. 2 is a graph illustrating the relationship between channel length and threshold voltage for a conventional MOSFET.

FIG. 1 is a schematic view of the structure of a conventional MOSFET (metal oxide semiconductor field effect transistor) 7 formed on a silicon substrate 1. MOSFET 7 includes a source/drain region 4 and a drain/source region 5 formed in substrate 1 with a channel region 6 therebetween. A gate electrode 3 is insulatively spaced from channel region 6 by a gate insulating film 2. As semiconductor devices have become more highly integrated, the dimensions of device portions such as MOSFETs have been scaled-down. In the case of MOSFETs, such scaling-down can be achieved by reducing the width of the gate electrode, i.e., by reducing the channel length "L". However, it is well-known that if the channel length L is reduced to less than approximately 50 nanometers (nm), so-called short-channel effects become significant, thereby making it difficult to control the threshold voltage of the MOSFET. This can be seen with reference to the graph of FIG. 2 which illustrates the relationship between channel length and threshold voltage. As can be seen in FIG. 2, when the channel length becomes less than about 50 nanometers, the threshold voltage varies as a function of the channel length.

Figure 3:
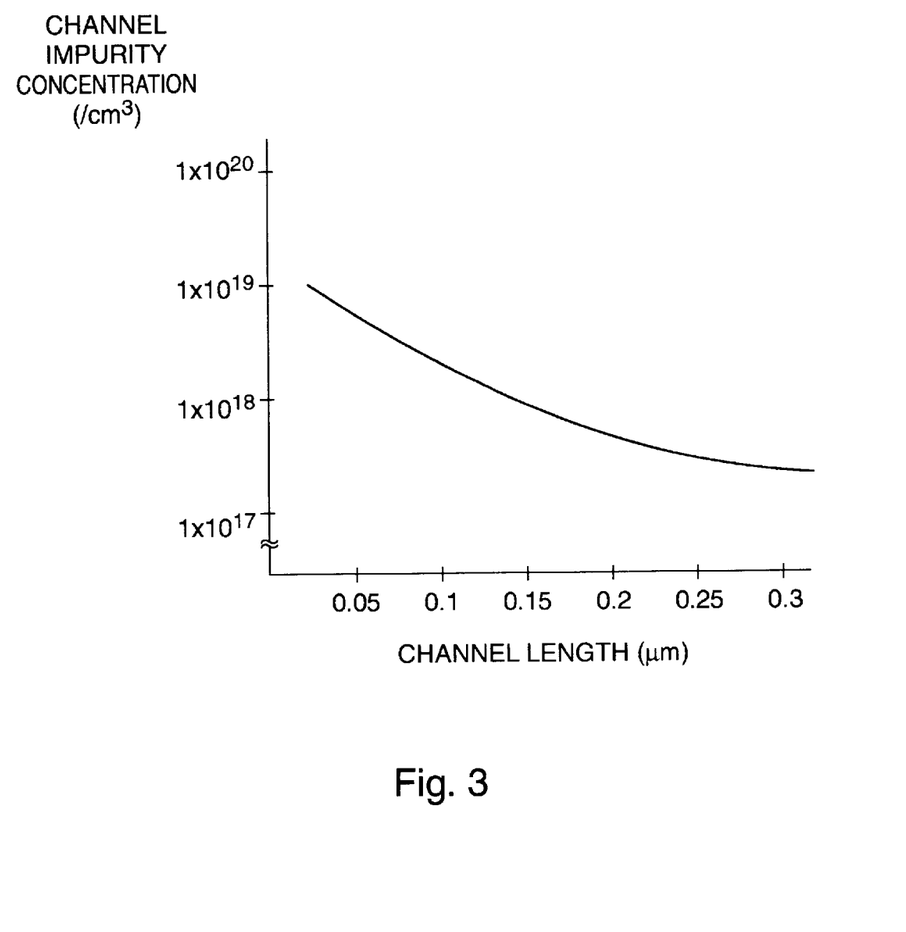
FIG. 3 is a graph illustrating the relationship between channel length and channel-impurity concentration for a conventional MOSFET.

One technique for suppressing short-channel effects is to increase the impurity concentration of channel region 6. As can be seen with reference to FIG. 3 which illustrates the relationship between channel length and channel-impurity concentration for suppressing short-channel effect, when the channel length is reduced to less than 50 nanometers (nm), the channel impurity concentration must be increased to approximately $1 \times 10^{19}$ cm$^{-3}$ or higher. However, if the channel impurity concentration is increased higher than approximately $7 \times 10^{18}$ cm$^{-3}$, the tunneling current (leak current) between the PN junctions can affect transistor operation. As a result, a deterioration in drain-to-substrate withstand voltage can occur, possibly disabling the transistor.

In short, although conventional MOSFETs can be scaled down by reducing the channel length, short-channel effects arise if the channel length becomes too small. While increasing the channel impurity concentration can suppress short-channel effects, the range over which the channel-impurity concentration can be increased is restricted in view of the deterioration in withstand voltage. Thus, the scaling-down of conventionally-structured MOSFETs is restricted by factors such as short-channel effect and deterioration in withstand voltage.

It would therefore be desirable to provide a semiconductor device structure which overcomes these limitations.

SUMMARY OF THE INVENTION

In accordance with a first aspect of the present invention, a semiconductor device includes spaced apart source and drain regions formed in a semiconductor substrate and a gate electrode insulatively spaced from a channel region between the source region and the drain region by a gate insulating film. Insulating layers are respectively formed between the source region and the channel region and between the drain region and the channel region.

In accordance with another aspect of the present invention, a semiconductor device includes spaced apart source and drain regions formed in a semiconductor substrate and a gate electrode insulatively spaced from a channel region between the source and drain regions by a gate insulating film. Insulating layers are formed to at least partially cover facing portions of the source region and the drain region.

In accordance with another aspect of the present invention, a semiconductor device includes spaced apart source and drain regions formed in a semiconductor substrate and a floating gate electrode insulatively spaced from a channel region between the source region and the drain region by a gate insulating film. A control gate electrode is insulatively spaced from the floating gate electrode by an interlayer insulating film. Insulating layers are respectively formed between the source region and the channel region and between the drain region and the channel region.

In accordance with still another aspect of the present invention, a semiconductor device is manufactured by forming a gate electrode which is insulatively spaced from a semiconductor substrate by a gate insulating film. Side wall insulating films are then formed on the side walls of the gate electrode. The gate insulating film is selectively removed to expose surface portions of the semiconductor substrate. The exposed surface portions of the semiconductor substrate are isotropically etched to form recesses and insulating layers are formed on portions of the semiconductor substrate exposed by the recesses. The insulating layers are selectively removed using the sidewall insulating films as a mask and semiconductor layers are selectively grown in the recesses to form source and drain regions.

In accordance with still another aspect of the present invention, a semiconductor device is manufactured by forming a gate electrode which is insulatively spaced from a semiconductor substrate by a gate insulating film. The gate insulating film is selectively removed to expose surface portions of the semiconductor substrate. The exposed surface portions of the semiconductor substrate are anisotropically etched to form recesses and insulating layers are formed on surfaces of the semiconductor substrate exposed by the recesses. Portions of the insulating layers on horizontal surfaces of the recesses are removed and semiconductor layers are selectively grown in the recesses to form source and drain regions.

In accordance with the present invention, the insulating layers formed between the source region and the channel region and between the drain region and the channel region suppress short-channel effects. Thus, even for transistors having a short channel length (for example, less than 50 nanometers (nm)), the transistor leak current may be controlled and short-channel effects may be suppressed without increasing the channel-impurity concentration. Thus, deterioration in withstand voltage may be suppressed. In addition, these benefits are achieved while providing a transistor with sufficient on-current to enable normal transistor operation. Thus, the scaling limit imposed due to limitations on the increase of channel impurity concentration may be overcome.

These and other features and aspects of the invention will be more clearly understood from a reading of the following detailed description in conjunction with the appended drawings.

DETAILED DESCRIPTION

Figure 4:
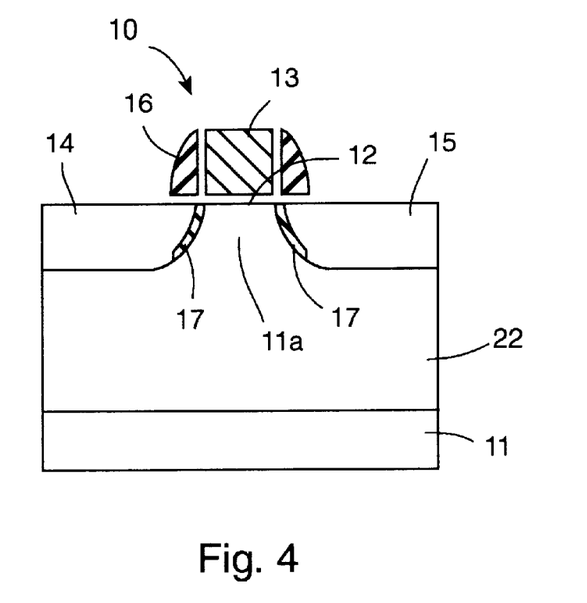
FIG. 4 is a schematic cross-sectional view of a semiconductor device in accordance with a first embodiment of the present invention.

FIG. 4 is a cross-sectional view of a MOSFET 10 in accordance with a first illustrative, but non-limiting, embodiment of the present invention. MOSFET 10 includes spaced apart N-type source/drain and drain/source regions 14 and 15 formed in a P-type well 22 of a semiconductor substrate 11. The spaced apart regions 14 and 15 define a channel region 11a therebetween. A gate electrode 13 is insulatively spaced from channel region 11a by a gate insulating film 12. Sidewall insulating films 16 are formed on the sidewalls of gate electrode 13. Thin insulating barrier layers 17 are respectively formed between source/drain region 14 and channel 11a and between drain/source region 15 and channel region 11a. Insulating barrier layers 17 function to suppress short-channel effects. Specifically, insulating barrier layers 17 prevent the formation of current paths in the vicinity of the deepest portions of source/drain and drain/source regions 14 and 15. Accordingly, electrical conduction is significantly impeded in the vicinity of the deepest portions of the source/drain and drain/source regions 14 and 15, thereby suppressing short-channel effects. Nonetheless, immediately beneath gate electrode 13, sufficient on-current is provided between source/drain and drain/source regions 14 and 15 even with the presence of insulating barrier layers 17 since the channel length is short and insulating barrier layers 17 are sufficiently thin to permit charge tunneling. Thus, even where the channel length of MOSFET 10 is short (for example, less than 50 nanometers), it is possible to control the leak current for transistors, suppress short-channel effects, and suppress the occurrence of deterioration in withstand voltage. In addition, these benefits can be obtained while still providing sufficient on-current for the transistor operation.

Figure 5:
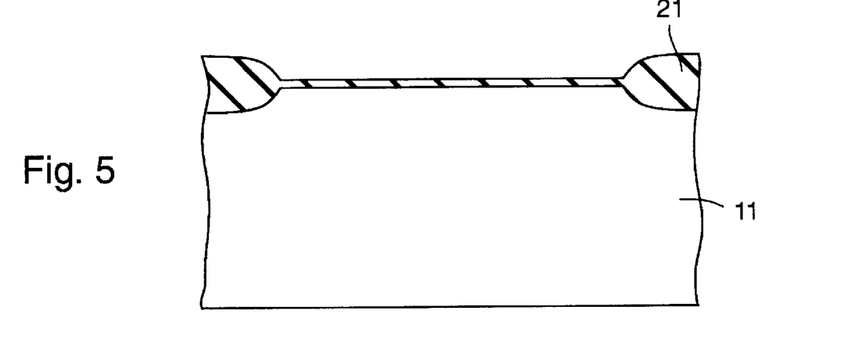
FIGS. 5–11 are cross-sectional views illustrating a method of manufacturing the semiconductor device of FIG. 4.

A method for manufacturing MOSFET 10 will be explained below with reference to FIGS. 5–11. As shown in FIG. 5, a field oxide film 21 is formed on the surface of an N-type silicon substrate 11 by the LOCOS (Local Oxidation of Silicon) technique. For example, field oxide film 21 may be formed to a thickness of approximately 150 to 300 nanometers (nm) in device isolation regions and to a thickness of less than 20 nanometers (nm) in device active regions. Alternatively, device active regions may be defined using the STI (Shallow Trench Isolation) technique.

Figure 6:
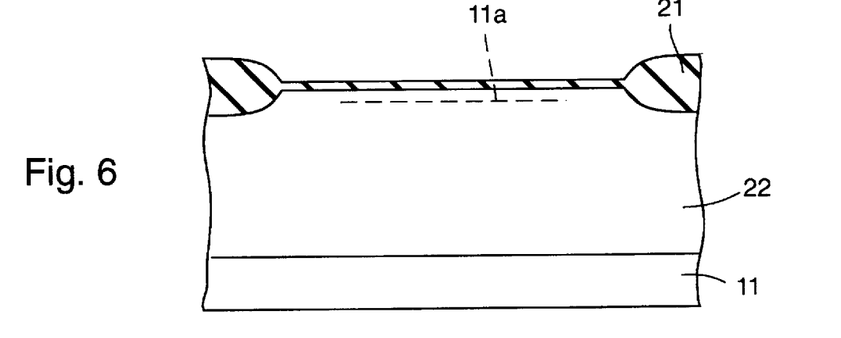

Subsequently, P-type impurities are implanted into the entire surface of substrate 11 to form a P-well region 22 as shown in FIG. 6. For example, boron (B) may be ion-implanted at an accelerating voltage of 350 keV and a dose of $2 \times 10^{13}$ cm$^{-2}$. Then, P-type impurities are implanted into the channel region 11a for controlling the threshold voltage of MOSFET 10. For example, boron (B) ions may be ion-implanted at an accelerating voltage of 60 keV and a dose of $1 \times 10^{13}$ cm$^{-2}$.

Figure 7:
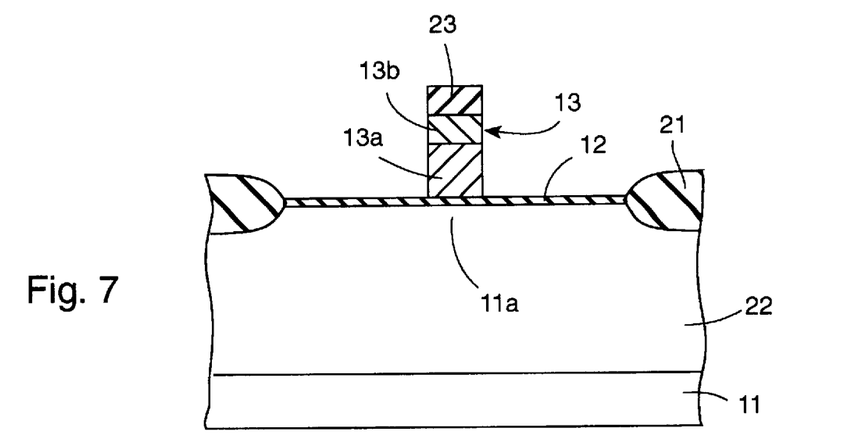

After selectively removing the field oxide film 21 from the device active region, gate insulating film 12 is formed to a thickness of approximately 1 to 3 nanometers (nm) by thermal oxidation or by LP-CVD (Low Pressure-Chemical Vapor Deposition) as shown in FIG. 7. Gate insulating film 12 may be a thermal oxide film or, to improve withstand voltage, a nitrided oxide film. Gate insulating film 12 may also be a nitride film. Next, a polysilicon film 13a doped with N-type impurities is formed to a thickness of approximately 30 to 100 nanometers (nm) over the entire surface of gate insulating film 12. A refractory metal film or a refractory metal silicide film 13b (such as tungsten (W) or tungsten silicide (WSi)) is formed to a thickness of approximately 30 to 60 nanometers (nm) over the surface of polysilicon film 13a to reduce the resistivity of the gate electrode and thereby provide a polycide gate structure or a polysilicon-tungsten stacked structure. A silicon nitride ($Si_3N_4$) film 23 having a thickness of approximately 30 to 60 nanometers (nm) may, as required, be formed over film 13b for the protection thereof. Then, a mask (not shown) such as a patterned photoresist is formed and silicon nitride film 23, film 13b, and polysilicon film 13a are anisotropically etched by reactive ion etching (RIE), thereby forming a gate electrode 13. The channel length corresponding to gate electrode 13 is less than 50 nanometers (nm). To pattern a gate electrode corresponding to a channel length of 50 nanometers (nm) or less, an electron beam exposure method is applied. Using an RIE technique with a halogen-based reaction gas for etching, it is also possible to etch gate electrode 13 with a high selectivity relative to gate insulating film 12.

Figure 8:
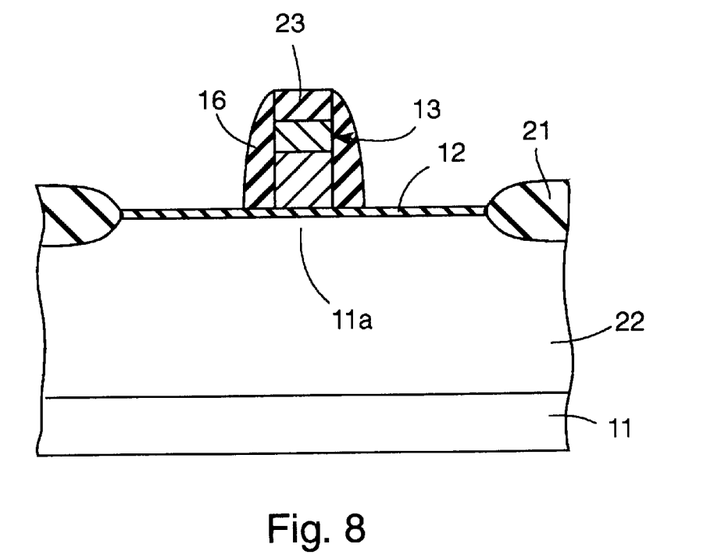

Then, as shown in FIG. 8, a silicon nitride ($Si_3N_4$) film or a silicon dioxide ($SiO_2$) film having a thickness of approximately 10 to 30 nanometers (nm) is formed by LP-CVD or some other process over the entire surface of substrate 11. Next, sidewall insulating films 16 are formed on the side faces of gate electrode 13 and the $Si_3N_4$ film 23 by anisotropically etching the silicon nitride film or silicon dioxide film using RIE.

Figure 9:
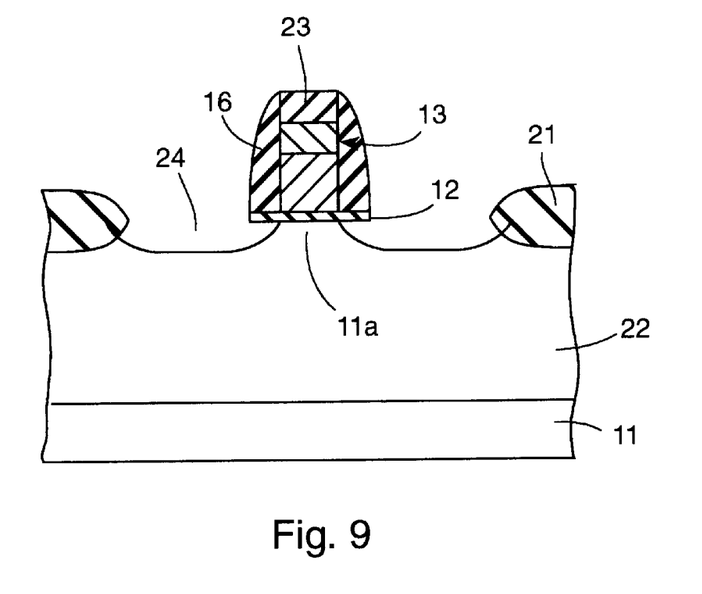

Subsequently, as shown in FIG. 9, gate insulating film 12 is selectively removed to expose the surface of the silicon substrate 11. If gate insulating film 12 has been formed by thermal oxidation, the film can be removed by selective wet etching using a hydrogen-fluoride (HF)-based etching solution. After the selective removal of gate insulating film 12, the surface of substrate 11 is isotropically etched to form recesses 24 for the source/drain and drain/source regions. The depth of recesses 24 is substantially equal to the thickness of sidewall insulating film 16. That is, in the present embodiment, since the thickness of sidewall insulating film 16 is approximately 10 to 30 nanometers (nm), the depth of recesses 24 is approximately 10 to 30 nanometers (nm). This condition permits etching of substrate 11 up to a location immediately beneath the vicinity of the boundary of gate electrode 13 and sidewall insulating film 16. The isotropic etching of substrate 11 may be carried out using chemical dry etching (CDE) with fluoride atoms and oxygen atoms created from a gas mixture of $CF_4$ and $O_2$ by electric discharge within a microwave resonator. Using this etching technique, the substrate can be isotropically etched without disordering the crystals at the surface of substrate 11 exposed by recesses 24.

Figure 10:
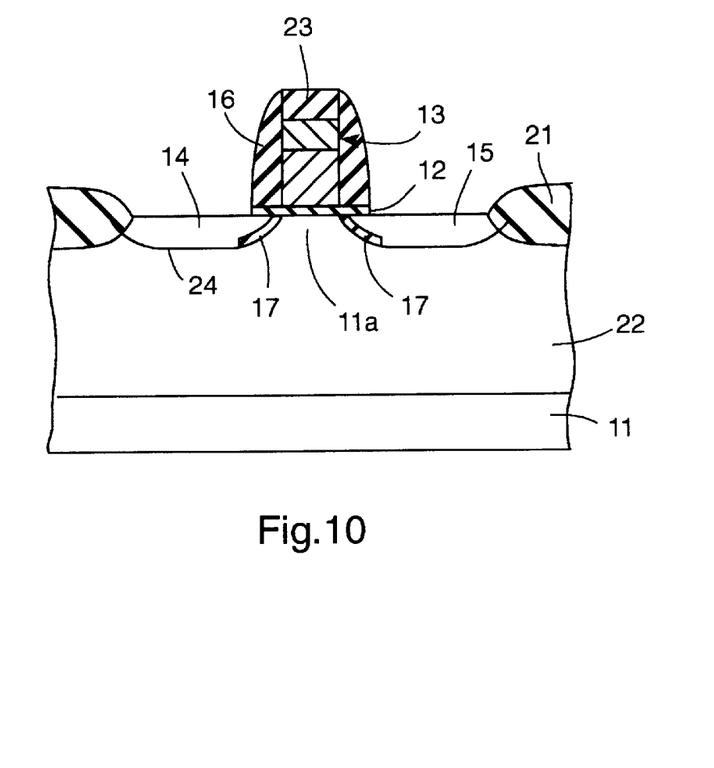
Figure 11:
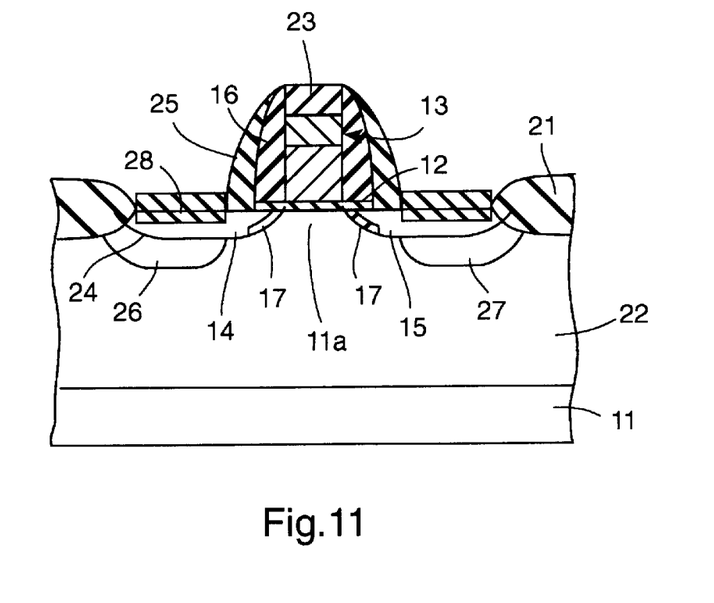

Next, insulating layers are formed to a thickness of about 0.5 to 2 nanometers (nm) on the surface of silicon substrate 11 exposed by recesses 24. The insulating layers are, for example, thermal oxide films formed in an oxygen ambient at approximately 1000° C. The insulating layers may also be a nitride film or a nitrided oxide film. The insulating layer is then selectively etched by RIE to leave insulating barrier layers 17 as shown in FIG. 10. During the RIE of the insulating layers, sidewall insulating films 16 serve as a mask so that the portions of the insulating layers located immediately below sidewall insulating films 16 remain unetched. Recesses 24 are then filled using epitaxial growth, thereby forming source/drain region 14 and drain/source region 15. If a solid-phase epitaxial growth method is used, source/drain region 14 and drain/source region 15 are doped with impurity during the growth of the epitaxial layer. Accordingly, the impurity concentration of source/drain region 14 and drain/source region 15 is controllable by the gas concentration used in the epitaxial growth method.

Thereafter, processing similar to conventional MOSFET processing is carried out. That is, an interlayer insulating film may then be formed, contact holes may be opened in the interlayer insulating film, and metal interconnections may be formed in the contact holes by known metallization methods.

The MOSFET of FIG. 10 may, if desired, be provided with salicide layers for reducing contact resistance. Specifically, with reference to FIG. 11, additional sidewall insulating films 25 (of $Si_3N_4$, for example) are formed on sidewall insulating films 16. Sidewall insulating films 25 are formed in order to provide a margin for adequately spacing the salicide layers from gate electrode 13 in consideration of withstand voltage. Of course, if a sufficient margin for forming the salicide layers is already present, sidewall insulating films 25 need not be formed. Then, a patterned photoresist is formed so that impurities such as arsenic, phosphorus, or the like may be ion-implanted into substrate 11 using as the patterned photoresist, gate electrode 13, sidewall insulating films 16, and sidewall insulating films 25 as a mask to thereby form diffusion layers 26, 27. A refractory metal or refractory metal silicide layer (such as Ti and TiN) is then formed by a sputtering method. Thereafter, salicide layers 28 are formed on the surfaces of source/drain region 14 and drain/source region 15 by a Rapid Thermal Anneal (RTA) in a nitrogen ambient. In this way, the contact resistance of source/drain region 14 and drain/source region 15 may be reduced. After the RTA step, unreacted materials (such as Ti and TiN) are removed.

In accordance with the present invention, thin insulating barrier layers 17 are respectively formed between source/drain region 14 and channel region 11a and between drain/source region 15 and channel region 11a. Insulating barrier layers 17 prevent the formation of current paths, caused by short-channel effects, near the deepest portions of the source/drain and drain/source regions, so that electrical conduction is significantly impeded in the vicinity of the deepest portions of the source/drain and drain/source regions. In this way, short-channel effects can be suppressed. On the other hand, immediately beneath the gate electrode, sufficient on-current is available because of the short channel length and because insulating barrier layer 17 is sufficiently thin as to permit charge tunneling.

Thus, even if MOSFET 10 has a short channel length (for example, less than 50 nanometers (nm)), the transistor leak current may be controlled and short-channel effects may be suppressed without increasing the channel-impurity concentration. Therefore, deterioration in withstand voltage may be suppressed. In addition, these benefits are achieved while providing a MOSFET with sufficient on-current to enable normal transistor operation. Thus, the scaling limit imposed due to limitations on the increase of channel impurity concentration may be overcome.

Figure 12:
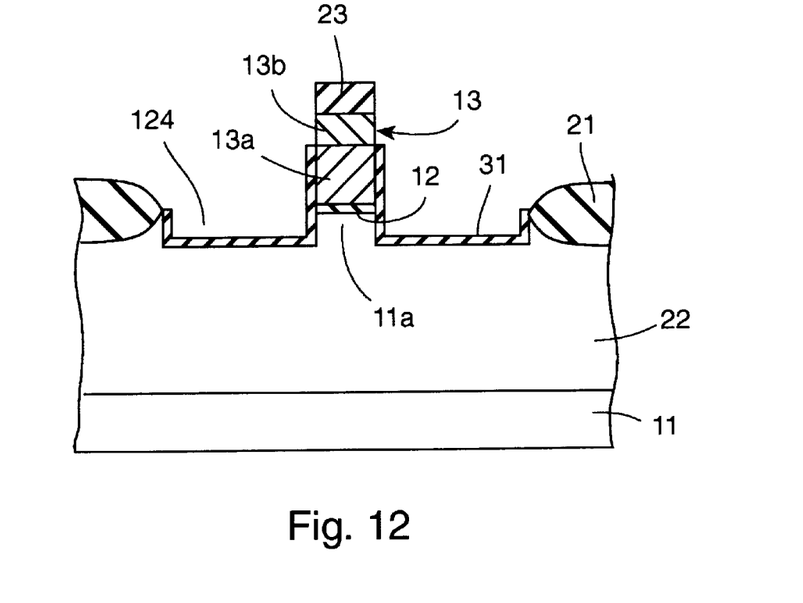
FIGS. 12 and 13 are cross-sectional views illustrating a method of manufacturing a semiconductor device in accordance with a second embodiment of the present invention.

MOSFET 10 of the above-described embodiment includes sidewall insulating films 16 which function as an etching mask for the selective etching of the insulating layer to form insulating barrier layers 17. However, the present invention is not limited in this respect. Thus, insulating barrier layers may be formed between the source/drain region and the channel region and between the drain/source region and the channel region without forming sidewall insulating films. A method for manufacturing a MOSFET without a step of forming sidewall insulating films will be described as a second embodiment of the present invention with reference to FIGS. 12 and 13. The method of the second embodiment includes steps corresponding to the steps of FIGS. 5–7 of the first embodiment and reference should be made to the above description. Similar reference numerals are used in FIGS. 12 and 13 to designate elements corresponding to elements of FIGS. 5–7. In addition, the film thicknesses, compositions, etc. for the second embodiment are similar to those for the corresponding films of the first embodiment unless otherwise noted.

After the step of FIG. 7, gate insulating film 12 is removed by wet etching to expose the surface of semiconductor substrate 11. Then, the surface of semiconductor substrate 11 is anisotropically etched by RIE to form recesses 124 (see FIG. 12). The depth of recesses 124 is about 10 to 30 nanometers (nm), sliilar to the depths of recesses 24 in the first embodiment. Then, a thermal oxide film 31 having a thickness of 0.5 to 2 nanometers (nm) is formed by thermal oxidation on the surface silicon substrate 11 exposed by recesses 124 and on the side walls of polysilicon layer 13a. As in the first embodiment, film 31 can also be a nitride film or a nitrided oxide film.

Figure 13:
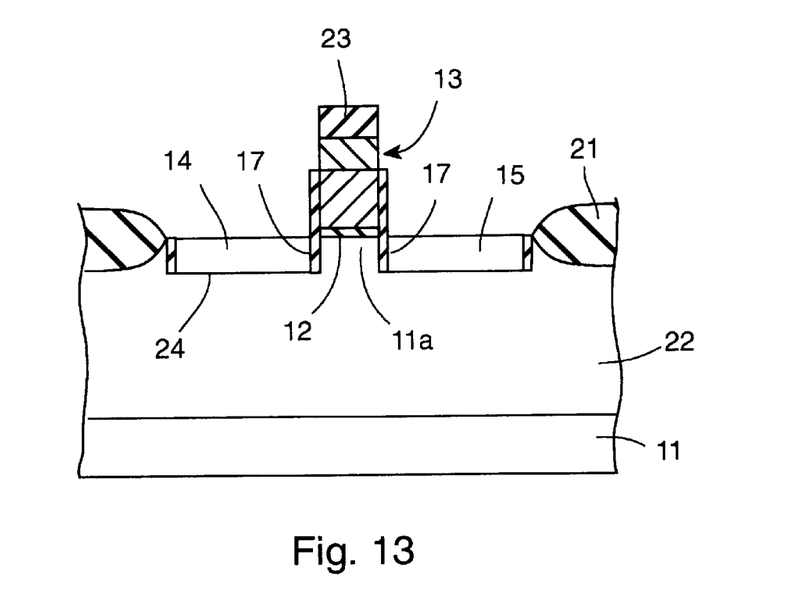

The portions of thermal oxide film 31 on the horizontal surfaces of semiconductor substrate 11 are removed by RIE. As in the first embodiment, an epitaxial layer is selectively grown in the recesses 124 by an epitaxial growth method to form source/drain region 14 and drain/source region 15 as shown in FIG. 13. In this way, an N-type MOSFET having insulating barrier layers respectively formed between source/drain region 14 and channel region 11a and between drain/source region 15 and channel region 11a is provided. It is readily apparent that salicide layers may be formed to reduce contact resistance as described above. The manufacturing steps for forming these salicide layers are similar to the steps described above with respect to the first embodiment, and an explanation thereof is omitted.

Figure 14:
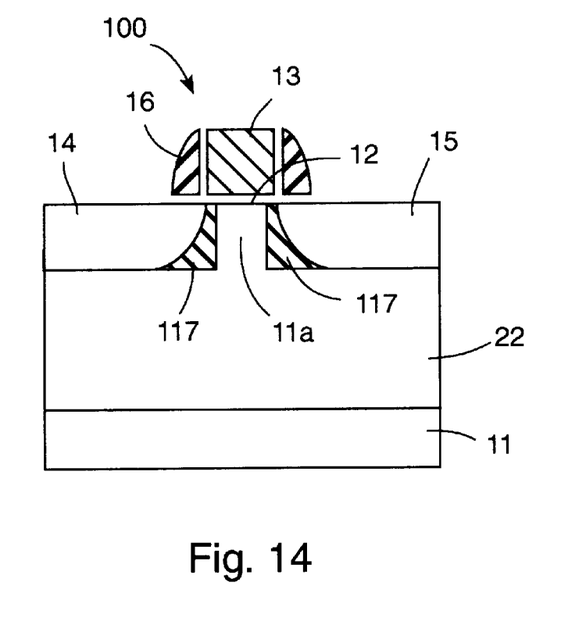
FIG. 14 is a schematic cross-sectional view of a semiconductor device in accordance with a third embodiment of the present invention.

FIG. 14 illustrates a semiconductor device in accordance with a third embodiment of the present invention which is a variation of the MOSFET 10 of FIG. 4. Specifically, FIG. 14 shows a MOSFET 100 including insulating barrier layers 117 which are formed to be thin at the portions of source/drain and drain/source regions 14 and 15 near the surface of the semiconductor substrate and to be thicker at the deep portions of source/drain and drain/source regions 14 and 15.

Specifically, the thickness of insulating layers gradually increases in the direction of increasing depth of the semiconductor substrate. In this way, the suppression of short-channel effects can be further improved near the deepest portions of the source/drain and drain/source regions 14 and 15.

Figure 15:
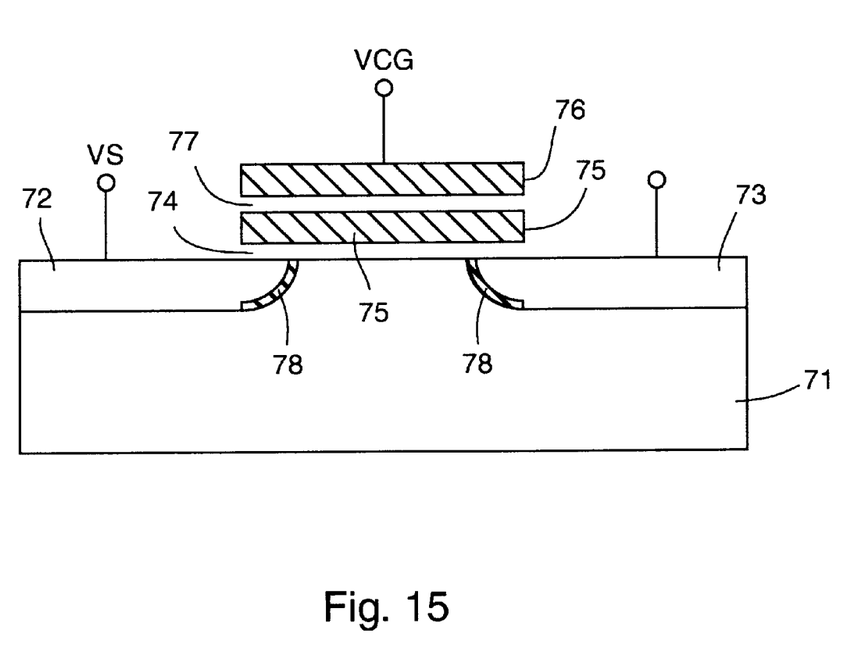
FIG. 15 is a cross-sectional view of a semiconductor device in accordance with a fourth embodiment of the present invention.

The present invention may also be applied to semiconductor devices which include charge storage layers such as EPROMs and EEPROMs. FIG. 15 is a cross-sectional view of EEPROM including a floating gate electrode as a charge storage layer. Source and drain regions 72 and 73 of a first conductivity type (e.g., N-type) are formed in a semiconductor substrate of a second conductivity type (e.g., P-type). A floating gate electrode 75 is insulatively spaced from a channel region between source and drain regions 72 and 73 by a gate (tunnel) insulating film 74. A control gate electrode 76 is insulatively spaced from floating gate electrode 75 by an interlayer insulating film 77. Insulating layers 78 are respectively formed between source region 72 and the channel region and between drain region 73 and the channel region.

In such a memory cell, during writing (programming), a low voltage (for example, 0 V) is applied to source region 72; a low voltage (for example, 0 V) is applied to the substrate 71; a high voltage $V_{pp}$ (for example, 12 V) is applied to control gate electrode 76; and a high voltage is applied to drain 73. In this way, an on-current flows between the drain and source regions, producing hot electron/hole pairs in the vicinity of the drain region. The holes flow into the substrate 71 as a substrate current and the hot electrons are injected into floating gate 75 to increase the threshold voltage thereof, thereby completing the writing operation.

Erasing of data is carried out by applying the high voltage $V_{pp}$ and a low voltage (for example, 0 V) to source region 72 and control gate 76, respectively. Drain region 73 is in a floating state. Under these conditions, a Fowler-Nordheim tunnel current flows through the thin tunnel insulating film 74 (approximately 10 nanometers) provided between source region 72 and floating gate 75. Thus, electrons are removed from the floating gate to lower the threshold voltage, thereby completing the erasing operation.

The floating gate memory cells described above can be arranged in a memory cell array (i.e., in rows and columns). The memory cells within the array can be arranged in a NOR or NAND configuration as is known in the art.

The floating gate type memory cell of FIG. 15 achieves the same advantages as described above with respect to transistors having a short channel length. Specifically, the transistor leak current may be controlled and short-channel effects may be suppressed without increasing the channel-impurity concentration. Thus, deterioration in withstand voltage may be suppressed. In addition, these benefits are achieved while providing a MOSFET with sufficient on-current to enable normal programming of the memory cell. Thus, the scaling limit imposed due to limitations on the increase of channel impurity concentration may be overcome.

While the present invention has been described above in terms of N-type MOSFETs, it will be appreciated that the teachings of the present invention also may be applied to P-type MOSFETs.

While there has been shown and described the preferred embodiments of the invention, it will be evident to those skilled in the art that various modifications may be made thereto without departing from the spirit and scope of the invention as set forth in the appended claims.

I claim:

1. A semiconductor device comprising:

spaced apart source and drain regions formed in a semiconductor substrate;

a gate electrode insulatively spaced from a channel region between said source region and said drain region by a gate insulating film; and insulating layers respectively formed between said source region and said channel region and between said drain region and said channel region, wherein said insulating layers gradually increase in thickness in a direction of increasing depth of said semiconductor substrate.

2. The semiconductor device according to claim 1, wherein said channel region has a channel length less than 50 nanometers.

3. The semiconductor device according to claim 1, wherein said insulating layers have a thickness less than 2 nanometers.

4. The semiconductor device according to claim 1, wherein said gate insulating film is formed of a material selected from the group consisting of thermal oxide, nitride, and nitrided oxide.

5. The semiconductor device according to claim 1, wherein said insulating layers are formed of a material selected from the group consisting of thermal oxide, nitride, and nitrided oxide.

6. The semiconductor device according to claim 1, wherein said semiconductor device is an EPROM.

7. The semiconductor device according to claim 1, wherein said semiconductor device is an EEPROM.

8. A semiconductor device comprising:

spaced apart source and drain regions formed in a semiconductor substrate;

a gate electrode insulatively spaced from a channel region between said source and drain regions by a gate insulating film; and insulating layers formed to at least partially cover facing portions of said source region and said drain region, wherein said insulating layers gradually increase in thickness in a direction of increasing depth of said semiconductor substrate.

9. A semiconductor device comprising:

spaced apart source and drain regions formed in a semiconductor substrate;

a floating gate electrode insulatively spaced from a channel region between said source region and said drain region by a gate insulating film;

a control gate electrode insulatively spaced from said floating gate electrode by an interlayer insulating film; and insulating layers respectively formed between said source region and said channel region and between said drain region and said channel region, wherein said insulating layers gradually increase in thickness in a direction of increasing depth of said semiconductor substrate.

10. A semiconductor device comprising:

a semiconductor substrate having a first region of a first conductivity type, a second region of a second conductivity type, and a third region of a third conductivity type, the first region and the second region being spaced apart from each other, at least a portion of the third region being disposed between the first and second regions;

a gate insulating film formed on the semiconductor substrate;

a gate electrode having a top and a first side, the gate electrode being insulatively spaced from the third region by the gate insulating film;

a first sidewall insulating film formed on the first region and having a first end facing away from the first side of the gate electrode and a second end disposed at the first side of the gate electrode; and a first insulating layer formed between the first region and the third region under the first sidewall insulating film and having a first end substantially under the first end of the first sidewall insulating film, wherein the gate insulating film physically separates the first sidewall insulating film from the first insulating layer.

11. The semiconductor device of claim 10, wherein the first sidewall film has a thickness substantially equal to a depth of the first region.

12. The semiconductor device of claim 10, further comprising:

a second sidewall insulating film formed on said semiconductor substrate and having a first end facing away from the gate electrode and a second end disposed at a second side of the gate electrode opposite to the first side; and a second insulating layer formed between the second region and the third region under the second sidewall insulating film and having a first end substantially under the first end of the second sidewall insulating film.

13. The semiconductor device of claim 10, wherein the first region is a source region, the second region is a drain region, and the at least a portion of the third region between the first and second regions is a channel region.

14. The semiconductor device of claim 10, wherein the first sidewall insulating film gradually increases in thickness in a direction toward the semiconductor substrate.

15. The semiconductor device of claim 10, wherein the first insulating layer has an arced shape.

16. The semiconductor device of claim 10, wherein the first insulating layer gradually increases in thickness in a direction away from the first sidewall insulating film.

17. The semiconductor device of claim 10, wherein a thickness of the first sidewall insulating film is in the range of approximately 10 to approximately 30 nanometers.

18. The semiconductor device of claim 10, wherein the first and second regions are spaced apart from each other by less than 50 nanometers.

19. The semiconductor device of claim 10, wherein a thickness of the first insulating layer is less than 2 nanometers.

20. The semiconductor device of claim 10, wherein the first sidewall insulating film is formed on the first region.

21. The semiconductor device of claim 10, wherein the first insulating layer has a second end substantially under the second end of the first sidewall insulating film.

22. The semiconductor device of claim 10, wherein the first insulating layer has a thickness substantially less than a thickness of the first sidewall insulating film.

23. The semiconductor device of claim 10, wherein the first insulating layer is a layer separate from the first sidewall insulating film.

24. A semiconductor device comprising:

a semiconductor substrate having a first region of a first conductivity type, a second region of a second conductivity type, and a third region of a third conductivity type, the first region and the second region being spaced apart from each other, at least a portion of the third region being disposed between the first and second regions;

a gate insulating film formed on the semiconductor substrate;

a gate electrode insulatively spaced from the third region by the gate insulating film;

a first sidewall insulating film formed on the first region and having a first end facing away from the gate electrode and a second end disposed at the gate electrode; and a first insulating layer formed between the first region and the third region under the first sidewall insulating film and having a first end substantially under the first end of the first sidewall insulating film, wherein the first insulating layer has an arced shape.

25. A semiconductor device comprising:

a semiconductor substrate having a first region of a first conductivity type, a second region of a second conductivity type, and a third region of a third conductivity type, the first region and the second region being spaced apart from each other, at least a portion of the third region being disposed between the first and second regions;

a gate insulating film formed on the semiconductor substrate;

a gate electrode insulatively spaced from the third region by the gate insulating film;

a first sidewall insulating film formed on the first region and having a first end facing away from the gate electrode and a second end disposed at the gate electrode; and a first insulating layer formed between the first region and the third region under the first sidewall insulating film and having a first end substantially under the first end of the first sidewall insulating film, wherein the first insulating layer gradually increases in thickness in a direction away from the first sidewall insulating film.

26. A semiconductor device comprising:

a semiconductor substrate having a first region of a first conductivity type, a second region of a second conductivity type, and a third region of a third conductivity type, the first region and the second region being spaced apart from each other, at least a portion of the third region being disposed between the first and second regions;

a gate insulating film formed on the semiconductor substrate;

a gate electrode insulatively spaced from the third region by the gate insulating film;

a first sidewall insulating film formed on the first region and having a first end facing away from the gate electrode and a second end disposed at the gate electrode; and a first insulating layer formed between the first region and the third region under the first sidewall insulating film and having a first end substantially under the first end of the first sidewall insulating film, wherein a thickness of the first sidewall insulating film is in the range of approximately 10 to approximately 30 nanometers.

27. A semiconductor device comprising:

a semiconductor substrate having a first region of a first conductivity type, a second region of a second conductivity type, and a third region of a third conductivity type, the first region and the second region being spaced apart from each other, at least a portion of the third region being disposed between the first and second regions;

a gate insulating film formed on the semiconductor substrate;

a gate electrode insulatively spaced from the third region by the gate insulating film;

a first sidewall insulating film formed on the first region and having a first end facing away from the gate electrode and a second end disposed at the gate electrode; and a first insulating layer formed between the first region and the third region under the first sidewall insulating film and having a first end substantially under the first end of the first sidewall insulating film, wherein a thickness of the first insulating layer is less than 2 nanometers.

* * * * *